(12) United States Patent
Schaefer et al.

(10) Patent No.: US 9,705,280 B2
(45) Date of Patent: Jul. 11, 2017

(54) SYSTEMS AND METHODS FOR ADAPTIVELY CONTROLLING A THERMOELECTRIC COOLER

(71) Applicant: Lockheed Martin Corporation, Bethesda, MD (US)

(72) Inventors: Andrew F. Schaefer, Binghamton, NY (US); John C Ceccherelli, Owego, NY (US); Paul T. Coyne, Endicott, NY (US); Stephen V. Robertson, Aurora, CO (US)

(73) Assignee: Lockheed Martin Corporation, Bethesda, MD (US)

( * ) Notice: Subject to any disclaimer, the term of this patent is extended or adjusted under 35 U.S.C. 154(b) by 105 days.

(21) Appl. No.: 14/630,639

(22) Filed: Feb. 24, 2015

(65) Prior Publication Data
US 2016/0245557 A1    Aug. 25, 2016

(51) Int. Cl.
| F25B 21/04 | (2006.01) |
| H01S 5/024 | (2006.01) |
| F25B 21/02 | (2006.01) |

(52) U.S. Cl.
CPC .......... *H01S 5/02415* (2013.01); *F25B 21/02* (2013.01); *F25B 2321/0212* (2013.01)

(58) Field of Classification Search
CPC ............ F25B 21/04; F25B 21/00; F25B 2313/02521; F25B 2313/02523;
(Continued)

(56) References Cited

U.S. PATENT DOCUMENTS 5,572,873 A * 11/1996 Lavigne ............... A61J 1/165
62/126
5,603,220 A * 2/1997 Seaman ................ A61J 1/165
62/3.62
(Continued)

FOREIGN PATENT DOCUMENTS

| EP | 2315074 A1 | 8/1993 |
| WO | WO2008/134436 A1 | 8/1993 |
(Continued)

OTHER PUBLICATIONS

Nonfinal Office Action dated Aug. 22, 2016, in U.S. Appl. No. 14/788,777.
(Continued)

*Primary Examiner* — Mohammad M Ali
(74) *Attorney, Agent, or Firm* — Miles & Stockbridge P.C.

(57) ABSTRACT

A system, method, and device for efficiently maintaining a stable operational temperature for precise operation of a laser. The system can include an ambient temperature sensor, a cooler controller adapted to control a cooler having an adjustable setpoint, a processor, and a memory coupled to the processor. The memory can store software instructions that, when executed by the processor, cause the processor to perform operations that can include receiving data from the sensor and determining the ambient temperature based on the received data. The determined ambient temperature can be compared to a current setpoint. When the delta exceeds a predetermined threshold, the setpoint can be adjusted to enable the operating environment of the laser to reach a control temperature closer to ambient conditions (and within a predetermined operating temperature range of the laser). Adjusted setpoint data can be transmitted to the cooler controller to adjust the setpoint of the cooler.

15 Claims, 6 Drawing Sheets

(58) Field of Classification Search
CPC .. F25B 2313/02531; F25B 2513/02533; F25B 2321/001; F25B 2321/002; F25B 2321/003; F25B 2321/02
USPC .............................................. 62/3.2, 3.3, 3.7
See application file for complete search history.

(56) References Cited

U.S. PATENT DOCUMENTS

| | | | |
|---|---|---|---|
| 5,822,102 | A | 10/1998 | Bodeep et al. |
| 6,476,957 | B1 | 11/2002 | Ward et al. |
| 7,245,833 | B1 | 7/2007 | Volkening |
| 8,061,149 | B1 * | 11/2011 | Gowans ............. A61J 1/165 62/3.62 |
| 8,472,806 | B2 | 6/2013 | Woodward et al. |
| 8,538,270 | B2 | 9/2013 | Seidel et al. |
| 8,593,581 | B2 | 11/2013 | Mccarthy et al. |
| 2002/0021463 | A1 * | 2/2002 | Turner ............. H04B 10/077 398/79 |
| 2002/0075546 | A1 | 6/2002 | Webb |
| 2002/0076132 | A1 | 6/2002 | Peral et al. |
| 2003/0002046 | A1 * | 1/2003 | Myers ............. H04B 10/079 356/459 |
| 2003/0142701 | A1 * | 7/2003 | Pontis ............. H01S 5/141 372/20 |
| 2003/0142702 | A1 * | 7/2003 | Pontis ............. H01S 5/141 372/20 |
| 2004/0211900 | A1 * | 10/2004 | Johnson ............. G01N 21/3504 250/338.5 |
| 2004/0218931 | A1 | 11/2004 | Frederiksen |
| 2006/0034616 | A1 | 2/2006 | Tipper |
| 2006/0239686 | A1 | 10/2006 | Hillis et al. |
| 2008/0106780 | A1 | 5/2008 | Niiho |
| 2008/0187319 | A1 * | 8/2008 | Stewart ............. H01S 5/0612 398/136 |
| 2008/0273561 | A1 * | 11/2008 | Fu ............. C09D 183/04 372/34 |
| 2009/0003840 | A1 | 1/2009 | Nahapetian |
| 2009/0036077 | A1 | 2/2009 | Woodward et al. |
| 2009/0268766 | A1 | 10/2009 | Ishibashi |
| 2009/0297155 | A1 | 12/2009 | Weiner et al. |
| 2009/0324251 | A1 | 12/2009 | Ilchenko et al. |
| 2010/0054757 | A1 | 3/2010 | Smith |
| 2010/0230621 | A1 * | 9/2010 | Rideout ............. G02F 1/01 250/551 |
| 2011/0059709 | A1 | 3/2011 | Collins, III |
| 2011/0150485 | A1 | 6/2011 | Seidel et al. |
| 2012/0002972 | A1 | 1/2012 | Stiffler et al. |
| 2012/0293959 | A1 * | 11/2012 | Trudel ............. G05D 23/1931 361/704 |
| 2013/0236187 | A1 | 9/2013 | Middleton et al. |
| 2015/0110494 | A1 | 4/2015 | Ghelfi et al. |
| 2016/0248609 | A1 | 8/2016 | Schaefer et al. |
| 2017/0003524 | A1 | 1/2017 | Schaefer et al. |
| 2017/0005732 | A1 | 1/2017 | Schaefer et al. |

FOREIGN PATENT DOCUMENTS

| | | |
|---|---|---|
| WO | WO2007/053477 A3 | 10/2010 |
| WO | WO2013/117216 A1 | 8/2013 |

OTHER PUBLICATIONS

Vikram Sekar, Kamran Entesari. Inductively-loaded RF MEMS Reconfigurable Filters, International Journal of RF and Microwave Computer-Aided Engineering, 2009.

Kamran Entesari, Gabriel M. Rebeiz. A Differential 4-bit 6.5-10Ghz RF MEMS Tunable Filter, IEEE Transactions on Microwave Theory and Techniques, vol. 53, No. 3, Mar. 2005.

Ignacio Llamas-Garro, Zabdiel Brito-Brito. Reconfigurable Microwave Filters, Microwave and Millimeter Wave Technologies from Phtonic Bandgap Devices to Antenna and Applications, Igor Minin (Ed.), ISBN: 978-953-7619-66-4. InTech. pp. 159-184.

Seung-Hun Lee, Hyuung-Jun Kin, Jong-In Song. Broadband photonic single sideband frequency up-converter based on the cross polarization modulation effect in a semiconductor optical amplifier for radio-over-fiber systems. Optics Express. Optical Society of America. vol. 22, No. 1. Jan. 2014.

Liam Riordan. Discrete- and Integrated Control of Power Amplifiers in Base-Station Applications, Analog Dialogue 42-04, Apr. 2009.

Mani Hossein-Zadeh, Kerry J. Vahala. Photonic RF Down-Converter Based on Optomechanical Oscillation. IEEE Photonics Technology Letters, vol. 20, No. 4. Feb. 15, 2008.

Avigor Brillant. Chapter 13, Laser Power and Temperature Control Loops, Digital and analog fiber optic communications for CATV and FTTx applications. ISBN: 978-0-8194-6757-7. 2008.

Nonfinal Office Action dated Sep. 22, 2016, in U.S. Appl. No. 14/788,785.

Nonfinal Office Action dated Sep. 26, 2016, in U.S. Appl. No. 14/630,638.

Notice of Allowance dated Jan. 19, 2017, in U.S. Appl. No. 14/788,777.

Notice of Allowance dated Mar. 1, 2017, in U.S. Appl. No. 14/788,785.

Notice of Allowance dated May 4, 2017, in U.S. Appl. No. 14/630,638.

* cited by examiner

SYSTEMS AND METHODS FOR ADAPTIVELY CONTROLLING A THERMOELECTRIC COOLER

Embodiments relate generally to systems and methods for controlling a device's operational environment and, more particularly, to systems and methods for adaptively controlling a thermoelectric cooler to efficiently maintain a stable operating temperature for precise operation of a laser.

Thermal electric coolers (TECs) can be used to help a device maintain a stable temperature by drawing heat away or towards the device. For example, in photonic applications TECs can be used to maintain an operating temperature for a laser. Temperature maintenance can be important for the operation of a laser in applications that require stable power and low optical frequency dither. A photonic to radio frequency (RF) converter (PRFC) is an example of such an application that can require precision control for laser power and frequency. Generally, TECs can be set to maintain a fixed temperature setpoint. However this scheme is problematic in environments in which the ambient temperature is greatly different than that of a fixed setpoint and can vary greatly in short time frames. This can cause the TEC to draw increasingly higher amounts of current to mitigate a high temperature delta between the ambient temperature and the fixed setpoint, leading to thermal runaway, TEC overload, and/or the inability to maintain temperature. A need may exist to more efficiently maintain a stable operating environment for precise operation of a laser.

One embodiment includes a system for adaptively controlling a cooler device to efficiently maintain a stable operational temperature for precise operation of a laser. The system can comprise an ambient temperature sensor, a cooler controller adapted to control a cooler device having an adjustable setpoint, a processor coupled to the ambient temperature sensor and the cooler controller, and a memory. The memory can store software instructions that, when executed by the processor, cause the processor to perform operations. The operations can include receiving temperature data from the ambient temperature sensor and determining the ambient temperature based on the received temperature data. The operations can further include comparing a current setpoint of the cooler device to the determined ambient temperature. The operations can further include, when the delta between the current setpoint of the cooler device and the determined ambient temperature exceeds a predetermined threshold, adjusting the cooler setpoint to enable the operating environment of the laser to reach a control temperature closer to ambient conditions. The adjusting can include transmitting adjusted setpoint data to the cooler controller causing the cooler controller to adjust the setpoint of the cooler device. The control temperature can be a temperature within a predetermined operating temperature range of the laser.

Another embodiment can include a method for adaptively controlling a cooler device to efficiently maintain a stable operational temperature for precise operation of a laser. The method can include receiving, at a processor, temperature data from an ambient temperature sensor. The processor can determine current ambient temperature based on the received temperature data. A current setpoint of a cooler device can be compared to the determined ambient temperature to determine a delta between the current setpoint of the cooler device and the current ambient temperature. The cooler device can be coupled to the processor, have an adjustable temperature setpoint, and be configured to adjust the operating temperature of a laser. When the delta between the current setpoint of the cooler device and the current ambient temperature exceeds a predetermined threshold, the setpoint of the cooler device can be adjusted causing the operating environment of the laser to reach a control temperature closer to ambient conditions. The adjusting can include transmitting adjusted setpoint data to a cooler controller causing the cooler controller to adjust the setpoint of the cooler device. The cooler controller can be coupled to the cooler device and the processor, and the control temperature can be a temperature within a predetermined operating temperature range of the laser.

Another embodiment can include a nontransitory computer readable medium. The computer readable medium can store software instructions that, when executed by a processor, cause the processor to perform operations including receiving, at the processor, temperature data from an ambient temperature sensor. The operations can further include determining the current ambient temperature based on the received temperature data and comparing the current setpoint of a cooler device to the determined ambient temperature to determine a delta between the current setpoint of the cooler device and the current ambient temperature. The cooler device can be coupled to the processor, have an adjustable temperature setpoint, and be configured to adjust the operating temperature of a laser. The operations can further include, when the delta between the current setpoint of the cooler device and the current ambient temperature exceeds a predetermined threshold, adjusting the setpoint of the cooler device causing the operating environment of the laser to reach a control temperature closer to ambient conditions. The adjusting can include transmitting adjusted setpoint data to a cooler controller causing the cooler controller to adjust the setpoint of the cooler device. The cooler controller can be coupled to the cooler device and the processor, and the control temperature can be a temperature within a predetermined operating temperature range of the laser.

DETAILED DESCRIPTION

Figure 1:
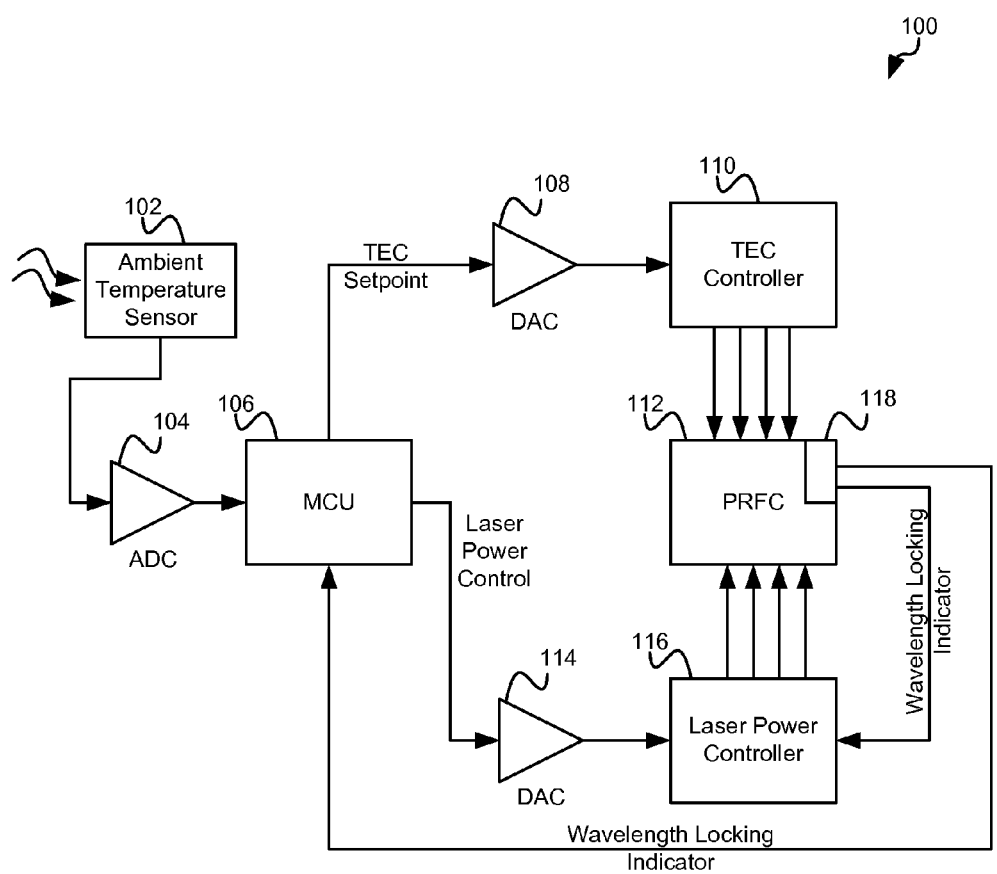
FIG. 1 is a block diagram of a system for adaptively controlling a TEC to efficiently maintain a stable operating temperature for precise laser operation, in accordance with an embodiment of the present disclosure.

FIG. 1 is a block diagram a system 100 for adaptively controlling a TEC to efficiently maintain a stable operating temperature for precise laser operation, in accordance with an embodiment of the present disclosure. System 100 employs a digital feedback loop and can include an ambient temperature sensor 102, an analog-to-digital converter (or "ADC") 104, an embedded processor or microcontroller (or "MCU") 106, a digital-to-analog (or "DAC") 108, a thermoelectric cooler controller (or "TEC controller") 110, a photonic-to-RF (radio frequency) converter (or "PRFC") 112, a laser power controller 116, and a digital-to-analog converter 114. The PRFC 112 can include a wavelength locking indicator generator 118. The ambient temperature sensor 102 can transmit an ambient temperature signal to ADC 104 which can transmit ambient temperature data to MCU 106. MCU 106 can also receive a wavelength locking indicator from PRFC 112 and can transmit digital data to DAC 108 and DAC 114. DAC 108 can transmit a signal to TEC controller 110 which can adjust the setpoint of a thermoelectric cooler (TEC) (not shown) included in PRFC 112. DAC 114 can transmit a signal to laser power controller 116 which can adjust the power of a laser (not shown) included in PRFC 112.

In operation, MCU 106 can receive ambient temperature sensor data from ambient temperature sensor 102 via ADC 104 and a wavelength locking indicator from PRFC 112 and, based on the received ambient temperature sensor data and/or wavelength locking indicator, adjust the setpoint of PRFC 112's TEC via TEC controller 110 and/or the power of PRFC's laser via laser power controller 116 to efficiently maintain a stable operating temperature for precise operation of the laser, according to any one or more of the processes shown in FIGS. 3-6.

In embodiments, system 100 employs a digital feedback loop configuration to efficiently maintain a stable temperature for precise operation of the laser included in PRFC 112 by adaptively adjusting the TEC setpoint of the TEC included in PRFC 112 in response to ambient temperature changes. By adaptively adjusting the TEC setpoint according to any of the processes shown in FIGS. 3-5, system 100 can increase TEC efficiency by reducing the power draw of the TEC while also maintaining a stable operating temperature for precise operation of the laser of PRFC 112. Lasers have a wide range of operational temperatures and system 100 can efficiently maintain precise operation of a laser such as the laser included in PRFC 112 by providing stability in the operational temperature within an operational temperature range (as opposed to maintaining a fixed temperature setpoint).

In some embodiments, laser power controller 116 performs laser power and wavelength locking control for the laser of PRFC 112. In such embodiments, the digital feedback loop of system 100 links the laser power and wavelength locking control with the TEC setpoint adjustment such that the digital feedback loop can ensure that the frequency (or wavelength) lock of PRFC 112 experiences minimal disturbance during large changes in ambient temperature. For example, in some such embodiments, system 100 performs a collaborative method to achieve thermal and operational stability. In such embodiments, system 100 receives/detects the ambient temperature and subtracts the ambient temperature from the required temperature. If a large temperature gradient in which the TEC could potentially be overloaded is detected, then system 100 can lower (in the case of cooling) or raise (in the case of heating) the laser power to reduce the TEC's thermal load requirements. The MCU can gradually lower or raise the laser power while ensuring the wavelength locking is maintained, thus reducing the temperature gradient and ensuing TEC thermal load. Such a method ties together the TEC, laser power and wavelength looking to allow for a collaborative method to achieve thermal and operational stability.

Figure 5:
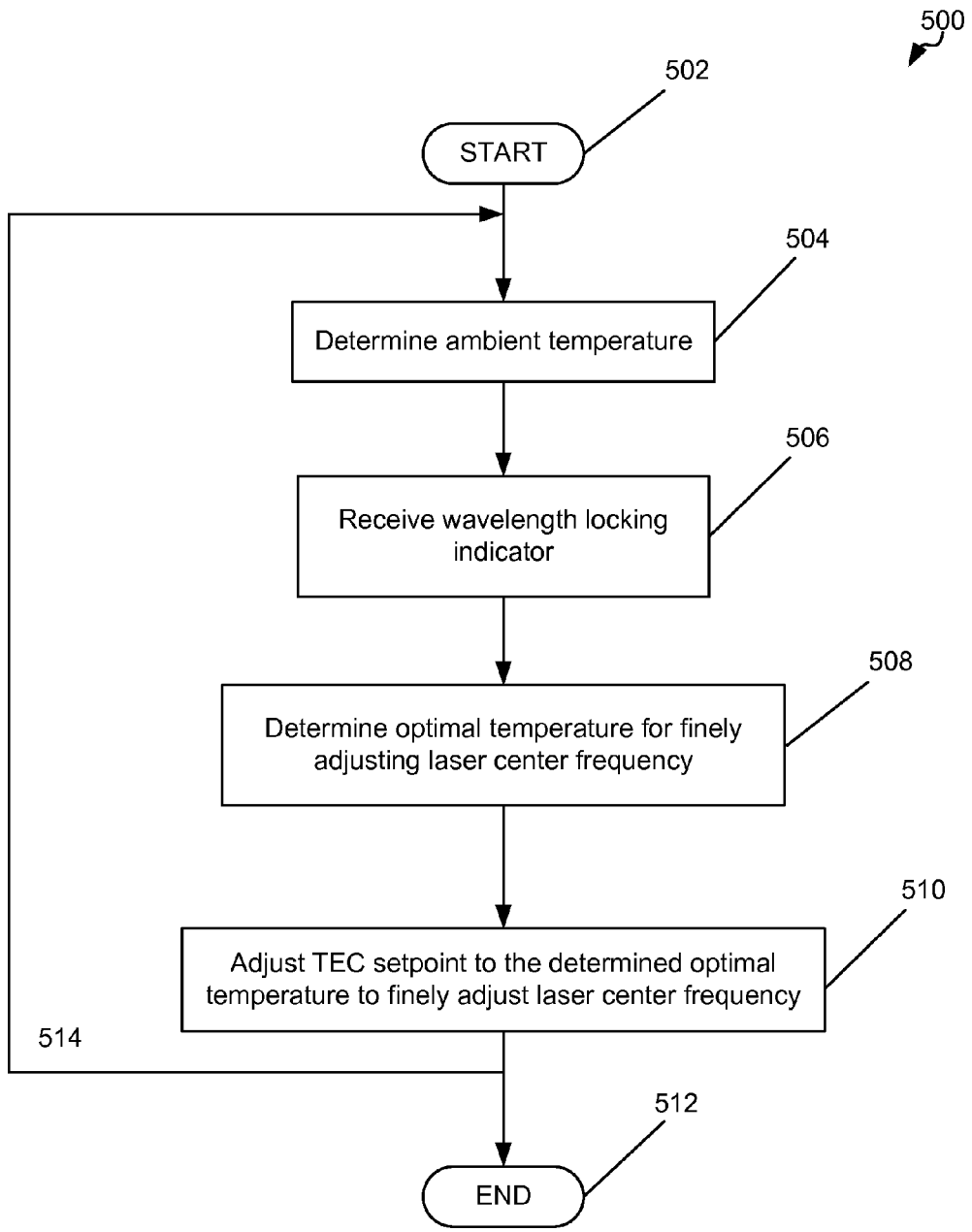
FIG. 5 is a flowchart showing a method for performing TEC adjustment to finely adjust the center frequency of a laser, in accordance with an embodiment of the present disclosure.

In some embodiments, system 100 can finely adjust the laser's center frequency by adjusting the TEC setpoint according to the process shown in FIG. 5. In such embodiments, the system 100 can finely adjust the laser's center frequency via the TEC controller 110 without requiring the laser power controller 116 to adjust the laser's center frequency.

In some embodiments, system 100 can include either TEC controller 110 or laser power controller 116. For example, in some such embodiments system 100 includes TEC controller 110 and DAC 108, and both laser power controller 116 and DAC 114 are not included. In other such embodiments, system 100 includes laser power controller 116 and DAC 114, and both TEC controller 110 and DAC 108 are not included.

It will be appreciated that PRFC 112 can include one or more lasers (not shown) and one or more TECs (not shown) which can be controlled, according to the processes shown in FIGS. 3-6, by MCU 106 via one or more laser power controllers 116 and one or more TEC controllers 110, respectively, to efficiently maintain a stable operating temperature for precise operation of the lasers.

Figure 3:
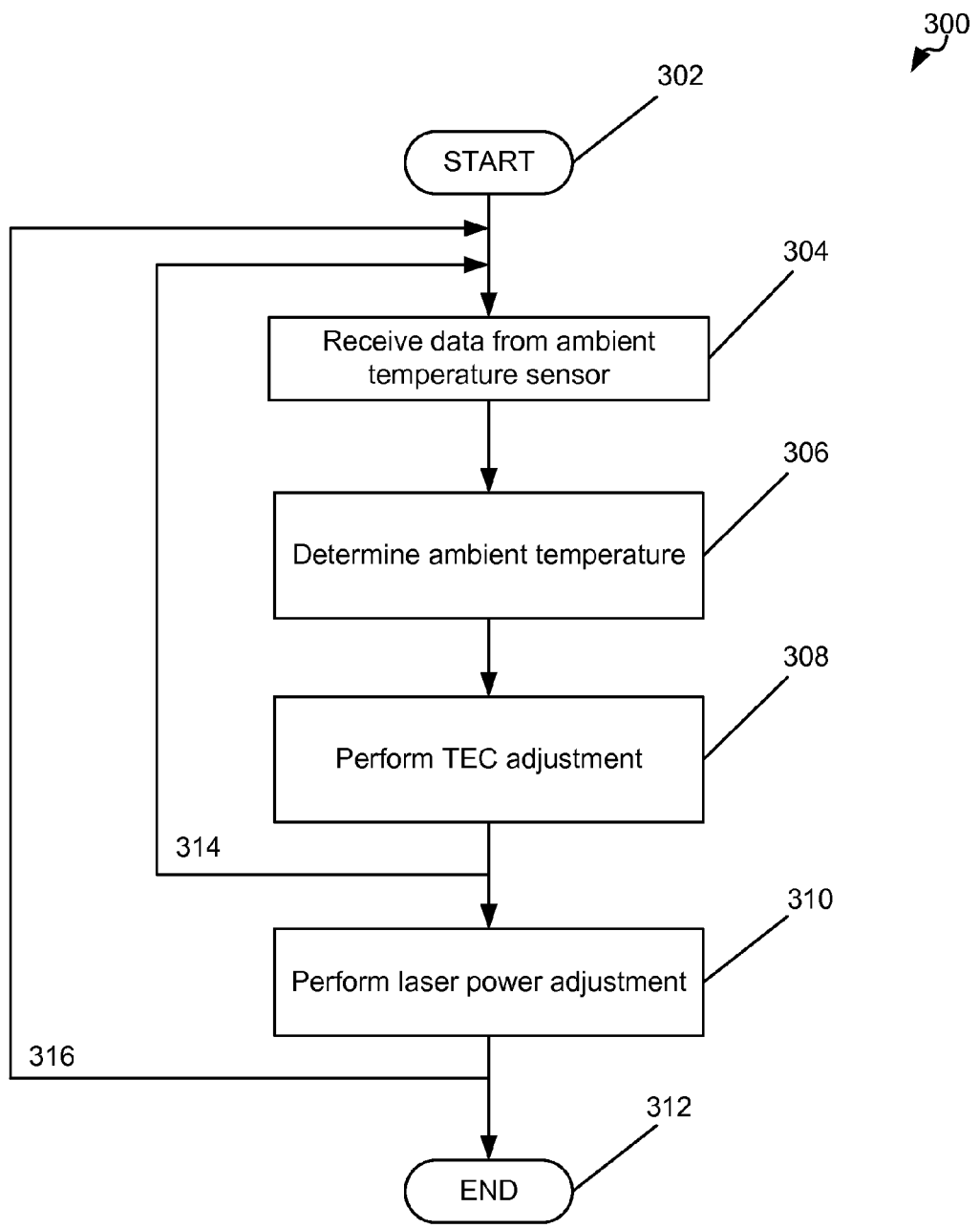
FIG. 3 is a flowchart showing a method for efficiently maintaining a stable operating temperature for precise laser operation, in accordance with an embodiment of the present disclosure.
Figure 4:
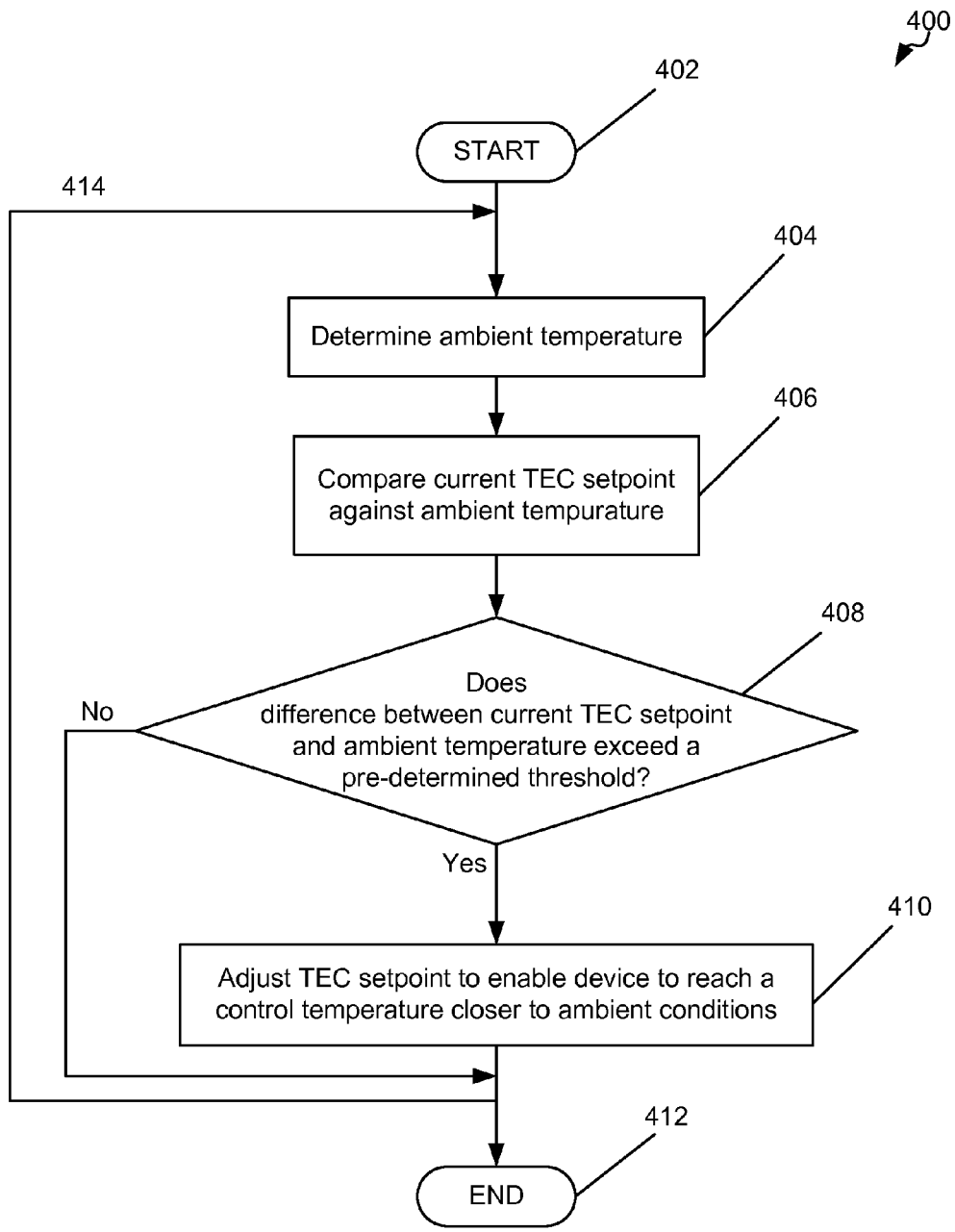
FIG. 4 is a flowchart showing a method for performing adaptive TEC adjustment to efficiently maintain a stable operating temperature, in accordance with an embodiment of the present disclosure.

In some embodiments, the laser(s) of PRFC 112 can have an optimal operating temperate range and MCU 106 can efficiently maintain a stable operating temperature within the optimal operating temperate range by controlling the TEC(s) of PRFC 112 via TEC controller(s) 110 according to any one or more of the processes shown in FIGS. 3-5.

In some embodiments, the TEC of PRFC 112 operates by the Peltier effect (i.e., thermoelectric effect) and has two sides arranged such that, when direct current (DC) flows through the TEC, it brings heat from one side to the other side, so that one side gets cooler while the other side gets hotter. The "hot" side of the TEC can be attached to a heat sink to dissipate heat, while the cool side of the TEC can go below room temperature. In some embodiments, multiple TECs can be cascaded together in PRFC 112 to maintain a lower temperature. In some embodiments, the TEC(s) included in PRFC 112 can be controlled by MCU 106 via TEC controller 110 by changing the input voltage/current supplied to the TEC.

In some embodiments, PRFC 112 can be replaced with any device that has an optimal operating temperate range and includes a cooler such as, for example, a TEC. In such embodiments, MCU 106 can efficiently maintain a stable operating temperature within the optimal operating temperate range by controlling the cooler (e.g., the TEC) via a cooler controller (e.g., TEC controller 110), according to any one or more of the processes shown in FIGS. 3-5.

Figure 2:
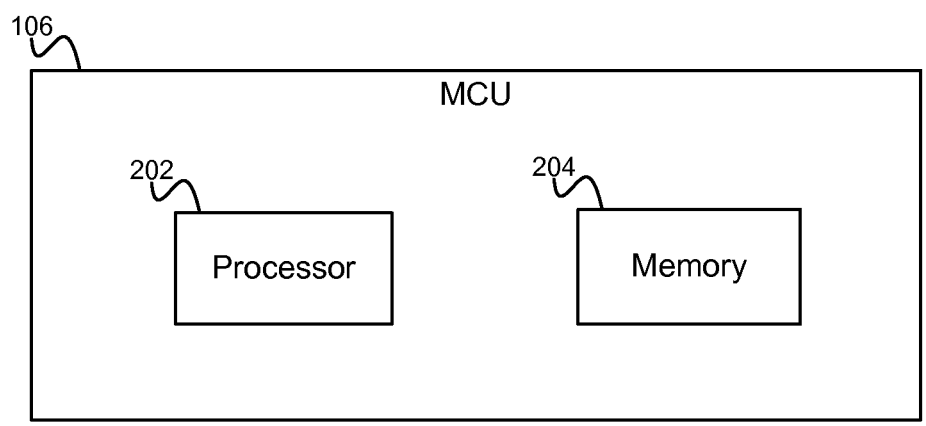
FIG. 2 is a block diagram of a microcontroller configured to adaptively control a TEC to efficiently maintain a stable operating temperature for precise laser operation, in accordance with an embodiment of the present disclosure.

FIG. 2 is a block diagram of microcontroller (or MCU) 106 of FIG. 1 configured to adaptively control a TEC to efficiently maintain a stable operating temperature for precise laser operation, in accordance with an embodiment of the present disclosure. System 200 can include controller (or MCU) 106 that can include a processor 202 and a memory 204. The MCU 106 can receive ambient temperature sensor data from ambient temperature sensor 102 via ADC 104 and/or a wavelength locking indicator from PRFC 112, and transmit data to TEC controller 110 (via DAC 108) and/or laser power controller 116 (via DAC 114).

In operation, the processor 202 will execute instructions stored on the memory 204 that cause the MCU 106 to receive ambient temperature sensor data from ambient temperature sensor 102 and/or a wavelength locking indicator from PRFC 112, and transmit data to TEC controller 110 and/or laser power controller 116, according to the processes shown in FIGS. 3-6.

It will be appreciated that although MCU 106 has been described as a microcontroller, MCU 106 can be any type of computing device such as, for example, other types of computer systems, integrated circuits, etc.

FIG. 3 is a flowchart showing an exemplary method 300 for efficiently maintaining a determined operating temperature for precise laser operation, in accordance with an embodiment of the present disclosure. Processing begins at 302 and continues to 304.

At 304 data is received from an ambient temperature sensor such as, for example, ambient temperature sensor 102 shown in FIG. 1. The data can be received at a processor/controller such as, for example, MCU 106 shown in FIGS. 1 and 2. The ambient temperature sensor can output an analog signal that is received by an analog-to-digital converter (ADC) such as, for example, ADC 104 shown in FIG. 1, which converts the signal to (digital) data and outputs the data to the processor (e.g., MCU 106). In some embodiments, the ambient temperature sensor can provide digital output to the processor. Processing continues to 306.

At 306, the ambient temperature is determined based on the data received from the ambient temperature sensor. The current ambient temperature can be determined by the processor based on the data received from the ambient temperature sensor. Processing continues to 308.

At 308, TEC adjustment is performed. TEC adjustment can include determining, by the processor, whether the difference between the current TEC setpoint and the current ambient temperature determined at 306 is greater than a predetermined threshold and, if the difference is greater than the predetermined threshold, adjusting the TEC setpoint within a predetermined operating temperature range to maintain a stable operating temperature for precise operation of a laser, as, for example, discussed hereinabove and shown in FIG. 4.

The processor (e.g., MCU 106) can adjust the TEC setpoint by outputting setpoint data to a TEC controller, such as, for example, TEC controller 110 shown in FIG. 1. In some embodiments, the output setpoint data can be converted into an analog signal by a digital-to-analog converter (DAC) such as, for example, DAC 108 shown in FIG. 1, prior to being received at the TEC controller. In some embodiments, the TEC controller receives digital data from the processor.

In some embodiments, performing TEC adjustment at 308 can manage TEC power consumption over a predetermined operating temperature range by adjusting the TEC setpoint to enable the device to reach a control temperature (within the operating temperature range) closer to ambient conditions in response to changes in the ambient temperature as, for example, discussed hereinabove and shown in FIG. 4. Processing continues to 310.

At 310, laser power adjustment is performed. Laser power adjustment can be performed directly, as shown, for example, in FIG. 6, and/or indirectly by adjusting the temperature of the laser which can affect the power output of the laser, as shown, for example, in FIG. 5.

In some embodiments, laser power adjustment at 310 can be performed indirectly by adjusting the setpoint of a TEC via a TEC controller (e.g., TEC controller 110 shown in FIG. 1) to finely adjust the laser power by adjusting the laser temperature, as shown, for example, in FIG. 5.

Figure 6:
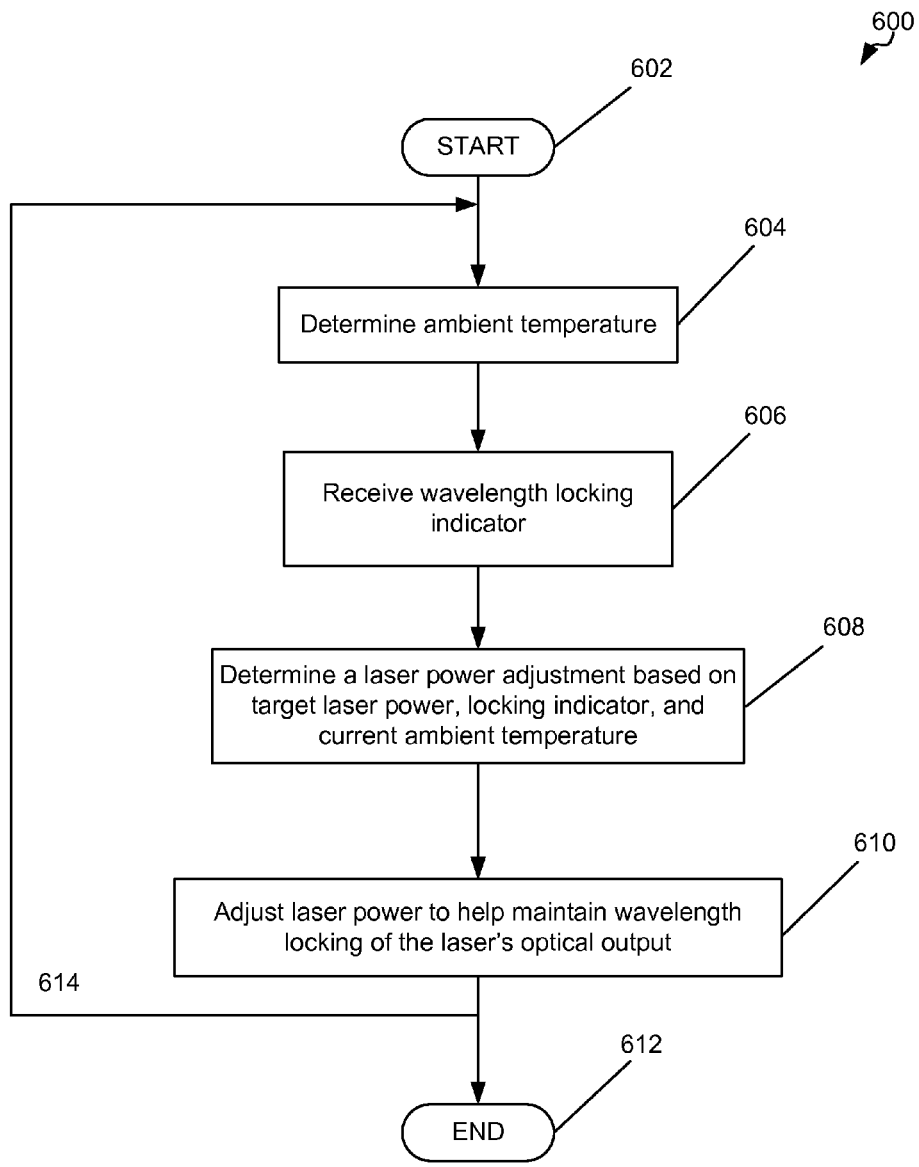
FIG. 6 is a flowchart showing a method for performing adaptive laser power adjustment to minimize laser frequency lock disturbances during changes in ambient temperature, in accordance with an embodiment of the present disclosure.

Additionally or alternatively, laser power adjustment at 310 can also be performed by directly adjusting the laser power via a laser power controller (e.g., laser power controller 116 shown in FIG. 1) that is included, along with the TEC controller, in a digital feedback loop (e.g., as shown in FIG. 1) such that the digital feedback loop links the laser power adjustment control with the TEC setpoint adjustment to ensure that laser frequency lock (or wavelength lock) experiences minimal disturbance during changes in ambient temperature (e.g., large/significant and/or not insignificant changes in ambient temperature), as shown, for example, in FIG. 6.

Additionally or alternatively, TEC adjustment at 308 and laser power adjustment at 310 can be linked to enable a collaborative method between the TEC, laser power and wavelength looking to achieve thermal and operational stability. For example, if a large temperature gradient in which the TEC could potentially be overloaded is detected at 306, laser power can be lowered (in the case of cooling) or raised (in the case of heating) to reduce the TEC's thermal load requirements, and TEC adjustment at 308 can be performed in conjunction with laser power adjustment at 310. For example, laser power can be gradually lowered or raised while ensuring the wavelength locking is maintained (e.g., via a controller such as, for example, MCU 106), thus reducing the temperature gradient and ensuing TEC thermal load (as shown, for example, in FIG. 6). Such embodiments link together the TEC, laser power and wavelength looking to allow for collaborative thermal and operational stability.

Processing continues to 312, where processing ends.

It will be appreciated that operations 304-310 may be repeated in whole or in part (examples of which are indicated by lines 314 and 316) to maintain current (regularly or continuously updated) ambient temperature readings and/or to efficiently maintain a stable operating temperature for precise operation of a laser.

FIG. 4 is a flowchart showing a method 400 for performing adaptive TEC adjustment to efficiently maintain a stable operating temperature, in accordance with an embodiment of the present disclosure. Processing begins at 402 and continues to 404.

At 404, the current ambient temperature is determined. The current ambient temperature can be determined by a processor such as, for example, MCU 106 shown in FIG. 1. The processor can be coupled to an ambient temperature sensor such as, for example, ambient temperature sensor 102 of FIG. 1, and can determine the current ambient temperature based on output of the ambient temperature sensor. Processing continues to 406.

At 406, the processor compares the current TEC setpoint against the current ambient temperature determined at 404. The comparing can include determining the difference between the current TEC setpoint and the current ambient temperature. Processing continues to 408.

At 408, the processor determines whether the difference between the current TEC setpoint and the current ambient temperature exceeds a predetermined threshold. When the difference between the current TEC setpoint and the current ambient temperature exceeds a predetermined threshold, processing continues to 410; otherwise processing continues to 412, where processing ends.

At 410, the TEC setpoint is adjusted to enable the device to reach a control temperature closer to ambient conditions. The TEC setpoint can be adjusted within an operating temperature range. TECs can operate over a wide range of temperatures (e.g., over 100 degrees Celsius) and maintain a desired operating temperature. However, there may be limitations are in terms of the total thermal load measured in watts that they can dissipate or provide while still maintaining a small device size. In order to prevent thermal overload and maintain small device size, some embodiments can employ other components (other than the TEC such as, for example, a controller that adjusts the power of a laser) to reduce thermal requirements of the TEC while allowing for at least 125 degrees Celsius operational range (e.g., −40 to 85 degrees Celsius). In some embodiments, the threshold at 408 can be 25 degrees Celsius and the TEC setpoint can be reduced under that threshold by changing laser power, as described, for example, in FIG. 6 below.

In some embodiments, if a large temperature gradient in which a TEC could potentially be overloaded is detected at 408, laser power can be lowered (in the case of cooling) or raised (in the case of heating) to reduce the TEC's thermal load requirements, and laser power adjustment can be performed in place of or in conjunction with TEC adjustment to link together the TEC, laser power and wavelength looking to allow for collaborative thermal and operational stability. For example, laser power can be gradually lowered or raised while also maintaining wavelength locking (e.g., via a processor and/or controller such as, for example, MCU 106 and/or controller 116), thereby reducing the temperature gradient and ensuing TEC thermal load.

Adaptively adjusting the TEC setpoint in response to ambient temperature changes at 410 can reduce power consumption of the TEC over the operating temperature range, thereby maintaining a stable operating temperature for precise operation of a laser in a power efficient manner.

For example, enabling the device to reach a control temperature closer to ambient conditions by adaptively adjusting the TEC setpoint responsively to changes in ambient temperature can reduce the power draw of the TEC when compared to, for example, a TEC with a fixed setpoint (e.g., when the ambient temperature is greatly different than the fixed TEC setpoint, when the ambient temperature can vary in short time frames, and/or when the ambient temperature can vary greatly in short time frames; each of these scenarios can cause the fixed setpoint TEC to draw increasingly higher amounts of current to mitigate a higher temperature delta leading to thermal runaway, TEC overload, and/or the inability to maintain temperature).

In some embodiments, the processor (e.g., MCU 106) can adjust the TEC setpoint via a TEC controller such as, for example, TEC controller 110 shown in FIG. 1. Processing continues to 412, where processing ends.

It will be appreciated that operations 404-414 may be repeated in whole or in part (examples of which are indicated by lines 314 and 316) to maintain current (regularly or continuously updated) ambient temperature readings, manage power consumption of the TEC, and/or to efficiently maintain a stable operating temperature for precise operation of a laser.

FIG. 5 is a flowchart showing a method 500 for performing TEC adjustment to finely adjust the center frequency of a laser, in accordance with an embodiment of the present disclosure. Processing begins at 502 and continues to 504.

At 504, the current ambient temperature is determined. The current ambient temperature can be determined by a processor such as, for example, MCU 106 shown in FIG. 1. The processor can be coupled to an ambient temperature sensor such as, for example, ambient temperature sensor 102 of FIG. 1, and can determine the current ambient temperature based on output of the ambient temperature sensor. Processing continues to 506.

At 506, a wavelength locking indicator is received. The processor can receive the wavelength locking indicator from a device/component such as, for example, the PRFC 112 shown in FIG. 1. The wavelength locking indicator can include information that indicates that fine adjustment of the laser center frequency may be desired and/or necessary. Processing continues to 508.

At 508, an optimal temperature for finely adjusting the laser center frequency is determined. Determining the optimal temperature can include determining the temperature at which the laser will generate the desired laser center frequency. The determining can be based on the current ambient temperature, the current TEC temperature, the current TEC setpoint, and/or the wavelength locking indicator. Processing continues to 510.

At 510, the TEC setpoint is adjusted to the optimal temperature determined at 508 to finely adjust the laser center frequency. Processing continues to 512, where processing ends.

It will be appreciated that operations 504-514 may be repeated in whole or in part (an example of which is indicated by line 514) to maintain current (regularly or continuously updated) ambient temperature readings and/or to maintain an optimal operating temperature for precise operation of a laser.

FIG. 6 is a flowchart showing a method 600 for performing adaptive laser power adjustment to minimize laser frequency lock disturbances during changes in ambient temperature, in accordance with an embodiment of the present disclosure. Processing begins at 602 and continues to 604.

At 604, the current ambient temperature is determined. The current ambient temperature can be determined by a processor such as, for example, MCU 106 shown in FIG. 1. The processor can be coupled to an ambient temperature sensor such as, for example, ambient temperature sensor 102 of FIG. 1, and can determine the current ambient temperature based on output of the ambient temperature sensor. Processing continues to 606.

At 606, a wavelength locking indicator is received. The processor can receive the wavelength locking indicator from a device/component such as, for example, the PRFC 112 shown in FIG. 1. The wavelength locking indicator can include information that indicates a disturbance in the system's frequency lock. Processing continues to 608.

At 608, a laser power adjustment is determined based on a target laser power, the wavelength locking indicator received at 606, the current ambient temperature, and/or the current TEC setpoint. For example, in some embodiments, if a large temperature gradient in which a TEC could potentially be overloaded is detected at 604, laser power can be lowered (in the case of cooling) or raised (in the case of heating) to reduce the TEC's thermal load requirements, and laser power adjustment can be performed in place of or in conjunction with TEC adjustment to link together the TEC, laser power and wavelength looking to allow for collaborative thermal and operational stability. For example, laser power can be gradually lowered or raised while ensuring the wavelength locking is maintained (e.g., via the processor such as, for example, MCU 106), thus reducing the temperature gradient and ensuing TEC thermal load. Processing continues to 610.

At 610, the laser power is adjusted based on the laser power adjustment determined at 608. For example, the laser power can be adjusted by the processor by sending a command to a digital to analog converter such as, for example, DAC 114, to change the control voltage of a controller such as, for example, laser power controller 116. The controller can be a current supply which can receive the command and then reduce or increase the current to the laser, thereby reducing or increasing the laser power. Processing continues to 612, where processing ends.

It will be appreciated that operations 604-614 may be repeated in whole or in part (an example of which is indicated by line 614) to maintain current (regularly or continuously updated) ambient temperature readings, and/or minimize laser frequency lock disturbances during changes in ambient temperature.

It will be appreciated that the modules, processes, systems, and sections described above can be implemented in hardware, hardware programmed by software, software instructions stored on a nontransitory computer readable medium or a combination of the above. A system for controlling the operating temperature of a laser, for example, can include using a processor configured to execute a sequence of programmed instructions stored on a nontransitory computer readable medium. For example, the processor can include, but not be limited to, a personal computer or workstation or other such computing system that includes a processor, microprocessor, microcontroller device, or is comprised of control logic including integrated circuits such as, for example, an Application Specific Integrated Circuit (ASIC). The instructions can be compiled from source code instructions provided in accordance with a programming language such as C, Ada, Java, C++, C#.net or the like. The instructions can also comprise code and data objects provided in accordance with, for example, the Visual Basic™ language, or another structured or object-oriented programming language. The sequence of programmed instructions and data associated therewith can be stored in a nontransitory computer-readable medium such as a computer memory or storage device which may be any suitable memory apparatus, such as, but not limited to ROM, PROM, EEPROM, RAM, flash memory, disk drive and the like.

Furthermore, the modules, processes systems, and sections can be implemented as a single processor or as a distributed processor. Further, it should be appreciated that the steps mentioned above may be performed on a single or distributed processor (single and/or multi-core, or cloud computing system). Also, the processes, system components, modules, and sub-modules described in the various figures of and for embodiments above may be distributed across multiple computers or systems or may be co-located in a single processor or system. Exemplary structural embodiment alternatives suitable for implementing the modules, sections, systems, means, or processes described herein are provided below.

The modules, processors or systems described above can be implemented as a programmed general purpose computer, an electronic device programmed with microcode, a hard-wired analog logic circuit, software stored on a computer-readable medium or signal, an optical computing device, a networked system of electronic and/or optical devices, a special purpose computing device, an integrated circuit device, a semiconductor chip, and a software module or object stored on a computer-readable medium or signal, for example.

Embodiments of the method and system (or their sub-components or modules), may be implemented on a general-purpose computer, a special-purpose computer, a programmed microprocessor or microcontroller and peripheral integrated circuit element, an ASIC or other integrated circuit, a digital signal processor, a hardwired electronic or logic circuit such as a discrete element circuit, a programmed logic circuit such as a PLD, PLA, FPGA, PAL, or the like. In general, any processor capable of implementing the functions or steps described herein can be used to implement embodiments of the method, system, or a computer program product (software program stored on a nontransitory computer readable medium).

Furthermore, embodiments of the disclosed method, system, and computer program product may be readily implemented, fully or partially, in software using, for example, object or object-oriented software development environments that provide portable source code that can be used on a variety of computer platforms. Alternatively, embodiments of the disclosed method, system, and computer program product can be implemented partially or fully in hardware using, for example, standard logic circuits or a VLSI design. Other hardware or software can be used to implement embodiments depending on the speed and/or efficiency requirements of the systems, the particular function, and/or particular software or hardware system, microprocessor, or microcomputer being utilized. Embodiments of the method, system, and computer program product can be implemented in hardware and/or software using any known or later developed systems or structures, devices and/or software by those of ordinary skill in the applicable art from the function description provided herein and with a general basic knowledge of the computer programming and network security arts.

Moreover, embodiments of the disclosed method, system, and computer program product can be implemented in software executed on a programmed general purpose computer, a special purpose computer, a microprocessor, or the like.

It is, therefore, apparent that there is provided, in accordance with the various embodiments disclosed herein, computer systems, methods and software for multi-level secure data import and export.

While the invention has been described in conjunction with a number of embodiments, it is evident that many alternatives, modifications and variations would be or are apparent to those of ordinary skill in the applicable arts. Accordingly, Applicants intend to embrace all such alternatives, modifications, equivalents and variations that are within the spirit and scope of the invention.

What is claimed is:

1. A system for adaptively controlling a cooler device configured to efficiently maintain a stable operational temperature of a laser for precise operation of the laser, the system comprising:
an ambient temperature sensor;
a cooler controller adapted to control the cooler device, the cooler device having an adjustable setpoint;
a processor coupled to the ambient temperature sensor and coupled to the cooler controller; and
a memory coupled to the processor, the memory having stored therein software instructions that, when executed by the processor, cause the processor to perform operations including
receiving temperature data from the ambient temperature sensor and determining an ambient temperature based on the received temperature data;
comparing a current setpoint of the cooler device to the determined ambient temperature;
receiving a wavelength locking indicator;
determining, responsive to the receiving of the wavelength locking indicator, an optimal temperature of the cooler device for finely adjusting laser center frequency of the laser based on the determined ambient temperature and the received wavelength locking indicator; and adjusting, when the difference between the current setpoint of the cooler device and the determined ambient temperature exceeds a predetermined threshold, the setpoint of the cooler device to the optimal temperature to enable an operating environment of the laser to reach a control temperature closer to ambient conditions and to finely adjust the laser center frequency, the adjusting including transmitting adjusted setpoint data to the cooler controller causing the cooler controller to adjust the setpoint of the cooler device, and the control temperature being a temperature within a predetermined operating temperature range of the laser.

2. The system of claim 1, wherein
the cooler device is a thermoelectric cooler (TEC), and
the cooler controller is a TEC controller adapted to control the TEC.

3. The system of claim 1, further comprising:
a laser power controller coupled to the laser and the processor,
wherein the processor is further caused to perform operations including
determining a laser power adjustment based on a target laser power of the laser, the received wavelength locking indicator, and the determined ambient temperature; and
adjusting the laser power, based on the laser power adjustment, by using the laser power controller to maintain wavelength locking of the laser.

4. The system of claim 1, further comprising:
a photonic to radio frequency (RF) converter (PRFC) coupled to the cooler controller, the PRFC including the laser and the cooler device.

5. The system of claim 1, wherein the adjusting the setpoint of the cooler device includes slowly incrementally adjusting the setpoint to enable the operating temperature of the laser to reach the control temperature so as to reduce power consumption of the cooler device.

6. A method for adaptively controlling a cooler device to efficiently maintain a stable operating temperature of a laser for precise operation of the laser, the method comprising:
receiving, at a processor, temperature data from an ambient temperature sensor;
determining, at the processor, current ambient temperature based on the received temperature data;
comparing a current setpoint of the cooler device to the determined ambient temperature to determine a difference between the current setpoint of the cooler device and the current ambient temperature, the cooler device being coupled to the processor, having an adjustable temperature setpoint, and being configured to adjust the operating temperature of the laser;
receiving a wavelength locking indicator;
determining, responsive to the receiving of the wavelength locking indicator, an optimal temperature of cooler device for finely adjusting laser center frequency based on the determined ambient temperature and the received wavelength locking indicator; and
and
adjusting, when the difference between the current setpoint of the cooler device and the current ambient temperature exceeds a predetermined threshold, the setpoint of the cooler device to the optimal temperature causing an operating environment of the laser to reach a control temperature closer to ambient conditions and fine adjustment of the laser center frequency, the adjusting including transmitting adjusted setpoint data to a cooler controller causing the cooler controller to adjust the setpoint of the cooler device, the cooler controller being coupled to the cooler device and the processor, and the control temperature being a temperature within a predetermined operating temperature range of the laser.

7. The method of claim 6, wherein
the cooler device is a thermoelectric cooler (TEC), and
the cooler controller is a TEC controller adapted to control the TEC.

8. The method of claim 6, further comprising:
determining a laser power adjustment based on a target laser power of the laser, the received wavelength locking indicator, and the determined ambient temperature; and
adjusting the power of the laser based on the determined laser power adjustment to maintain wavelength locking of the laser.

9. The method of claim 6, wherein
the cooler controller is coupled to a photonic to radio frequency (RF) converter (PRFC), and
the PRFC includes the laser and the cooler device.

10. The method of claim 6, wherein the adjusting the setpoint of the cooler device includes slowly incrementally adjusting the setpoint to enable the operating temperature of the laser to reach the control temperature closer so as to reduce power consumption of the cooler device.

11. A computer readable medium having stored thereon software instructions that, when executed by a processor of a communications system comprising the processor and an optical modulator, cause the processor to perform operations comprising:
receiving, at the processor, temperature data from an ambient temperature sensor;
determining, at the processor, current ambient temperature based on the received temperature data;
comparing a current setpoint of a cooler device to the determined ambient temperature to determine a difference between the current setpoint of the cooler device and the current ambient temperature, the cooler device being coupled to the processor, having an adjustable temperature setpoint, and being configured to adjust an operating temperature of a laser;
receiving a wavelength locking indicator;
determining, responsive to the receiving the wavelength locking indicator, an optimal temperature of the cooler device for finely adjusting laser center frequency based on the determined ambient temperature and the received wavelength locking indicator; and
adjusting, when the difference between the current setpoint of the cooler device and the current ambient temperature exceeds a predetermined threshold, the setpoint of the cooler device to the optimal temperature causing an operating environment of the laser to reach a control temperature closer to ambient conditions and fine adjustment of the of the laser center frequency, the adjusting including transmitting adjusted setpoint data to a cooler controller causing the cooler controller to adjust the setpoint of the cooler device, the cooler controller being coupled to the cooler device and the processor, and the control temperature being a temperature within a predetermined operating temperature range of the laser.

12. The computer readable medium of claim 11, wherein the cooler device is a thermoelectric cooler (TEC), and the cooler controller is a TEC controller adapted to control the TEC.

13. The computer readable medium of claim 11, the processor is further caused to perform operations including
  determining a laser power adjustment based on a target laser power of the laser, the received wavelength locking indicator, and the determined ambient temperature; and
  adjusting the power of the laser based on the determined laser power adjustment to maintain wavelength locking of the laser.

14. The computer readable medium of claim 11, wherein
  the cooler controller is coupled to a photonic to radio frequency (RF) converter (PRFC), and
  the PRFC includes the laser and the cooler device.

15. The computer readable medium of claim 11, wherein the adjusting the setpoint of the cooler device includes slowly incrementally adjusting the setpoint to enable the operating temperature of the laser to reach the control temperature so as to reduce power consumption of the cooler device.

\* \* \* \* \*